(12) United States Patent
Johnson et al.

(10) Patent No.: US 6,791,102 B2
(45) Date of Patent: Sep. 14, 2004

(54) PHASE CHANGE MEMORY

(75) Inventors: Brian G. Johnson, San Jose, CA (US); Charles H. Dennison, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/319,751

(22) Filed: Dec. 13, 2002

(65) Prior Publication Data

US 2004/0113232 A1 Jun. 17, 2004

(51) Int. Cl.[7] .................................................. H01L 29/72
(52) U.S. Cl. ........................................... 257/3; 257/529
(58) Field of Search .............................. 257/3, 529, 530

(56) References Cited

U.S. PATENT DOCUMENTS 5,534,711 A * 7/1996 Ovshinsky et al. ............ 257/3

2003/0073295 A1 * 4/2003 Xu ................................. 257/3

OTHER PUBLICATIONS

US patent application, pending, filed herewith, Brian Johnson et al. (P14858).

* cited by examiner

Primary Examiner—Edward Wojciechowicz
(74) Attorney, Agent, or Firm—Tony M. Martinez

(57) ABSTRACT

Briefly, in accordance with an embodiment of the invention, a phase change memory and a method to manufacture a phase change memory is provided. The phase change memory may include a phase change material having a bottom portion, a lateral portion, and a top portion. The phase change memory may further include a first electrode material contacting the bottom portion and the lateral portion of the phase change material and a second electrode material contacting the top portion of the phase change material.

19 Claims, 13 Drawing Sheets

PHASE CHANGE MEMORY

BACKGROUND

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states.

Typical materials suitable for such application include those utilizing various chalcogenide elements. The state of the phase change materials are also non-volatile in that, when set in either a crystalline, semi-crystalline, amorphous, or semi-amorphous state representing a resistance value, that value is retained until reset as that value represents a phase or physical state of the material (e.g., crystalline or amorphous).

Programming the phase change material to alter the phase or memory state of the material is accomplished by applying an electrical current through the material to heat the material. Reducing the current applied to the phase change material may be desirable to reduce power consumption of the memory device.

Thus, there is a continuing need for alternate phase change memory devices that reduce the current used to operate the phase change materials.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

Figure 1:
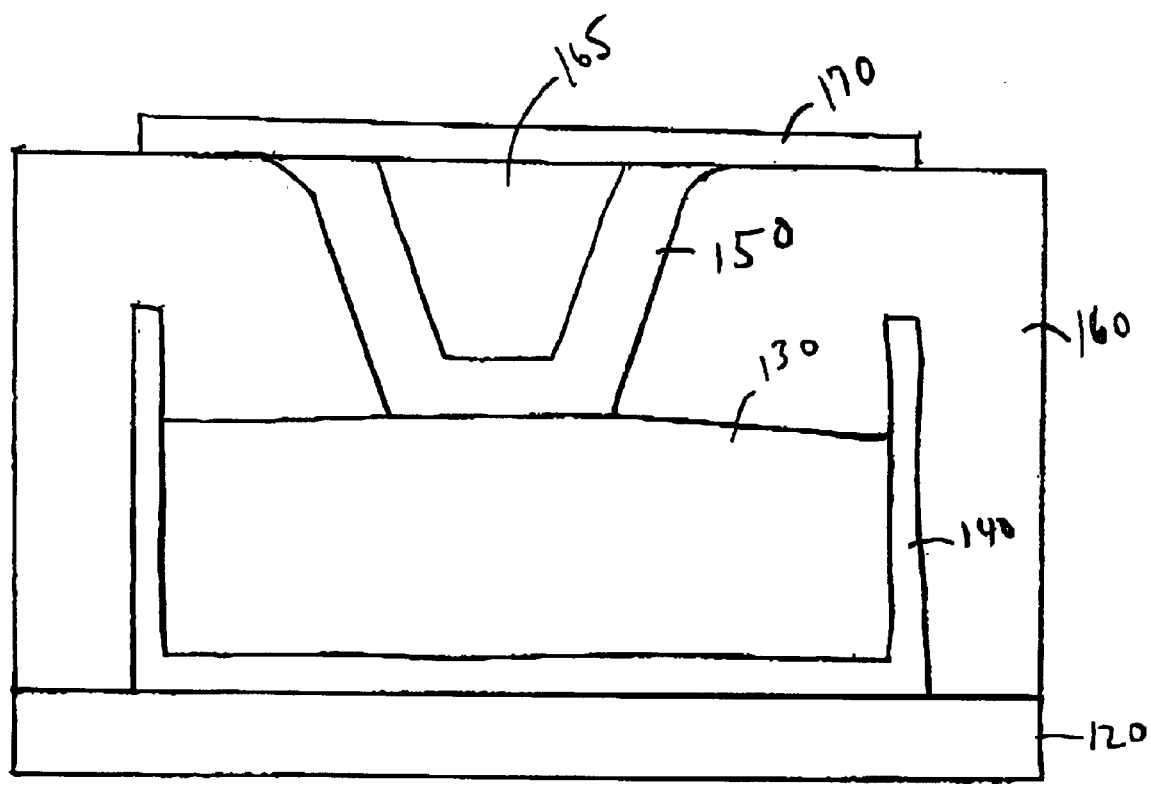
FIG. 1 is a cross-sectional view of a portion of a memory in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Similarly, the terms "over" and "overlying," may be used and are not intended as synonyms for each other. In particular embodiments, "overlying" may indicate that two or more elements are in direct physical contact with each other, with one over the other. "Over" may mean that two or more elements are in direct physical contact, or may also mean that one is over the other and that the two elements are not in direct contact.

The following description may include terms, such as over, under, upper, lower, top, bottom, etc. that are used for descriptive purposes only and are not to be construed as limiting. The embodiments of an apparatus or article of the present invention described herein can be manufactured, used, or shipped in a number of positions and orientations.

Turning to FIG. 1, an embodiment of a portion of a memory 100 is illustrated. Memory 100 may comprise a memory element 110 that may include a conductive material 120 over a semiconductor substrate (not shown). Memory element 110 may further include a memory material 136, an electrode 140, an electrode 150, a conductive material 170, and insulating materials 160 and 165.

Conductive materials 120 and 170 may be address lines, e.g., column and row lines, that may be used to program or read information stored using memory element 110. Conductive materials 120 and 170 may be coupled, in one embodiment, to external addressing circuitry (not shown). Conductive materials 120 and 170 may be referred to as column lines, row lines, bit lines, or word lines.

Conductive materials 120 and 170 may be electrically conductive materials. In one embodiment, conductive material 120 may be a silicided silicon material and conductive material 170 may be a layer of aluminum material, although the scope of the present invention is not limited in this respect.

Electrodes 140 and 150 may be electrically conductive materials. In various embodiments, electrode 140 may be composed of titanium nitride (TiN), titanium aluminum nitride (TiAlN), or titanium silicon nitride (TiSiN), although the scope of the present invention is not limited in this respect. Electrode 150 may be titanium (Ti), aluminum (Al), or copper (Cu).

Electrode 140 may be referred to as a lower electrode and electrode 150 may be referred to an upper electrode. Electrode 140 may contact a bottom surface or portion of memory material 130 and may contact a lateral surface or portion of memory material 130. The lateral surface or portion of memory material 130 may also be referred to as a sidewall surface or portion. Memory material 130 may be cylinder-shape, disk-shaped, or circular and electrode 140 may be cup-shaped, circular, or ring-shaped and may be formed surrounding and contacting the lateral and bottom surfaces of memory material 140. Electrode 140 may also be referred to as a cup-shaped conductive material, cup-shaped conductor, cup-shaped electrode, or cladding electrode.

Electrode 150 may be electrically isolated from electrode 140. Electrode 150 may be physically separated from electrode 140 by insulating material 160. Electrode 150 may contact a top portion or top surface of memory material 130. Electrodes 140 and 150 may make ohmic contact to memory material 130 and may also be referred to as electrical contacts. Electrodes 140 and 150 may be adapted to provide an electrical signal to memory material 130 to store information using memory material 130.

In one embodiment, memory material 130 may be a non-volatile, phase change material. In this embodiment, memory 100 may be referred to as a phase change memory. A phase change material may be a material having electrical properties (e.g. resistance) that may be changed through the application of energy such as, for example, heat, light, voltage potential, or electrical current. Examples of a phase change material may include a chalcogenide material or an ovonic material.

An ovonic material may be a material that undergoes electronic or structural changes and acts as a semiconductor when subjected to application of a voltage potential, an electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, memory material 130 may be a chalcogenide element composition of the class of tellurium-germanium-antimony ($Te_xGe_ySb_z$) material or a GeSbTe alloy, although the scope of the present invention is not limited to just these.

In one embodiment, if memory material 130 is a non-volatile, phase change material, then memory material 130 may be programmed into one of at least two memory states by applying an electrical signal to memory material 130 to alter the phase of memory material 130 between a substantially crystalline state and a substantially amorphous state, wherein a resistance of memory material 130 in the substantially amorphous state is greater than the resistance of memory material 130 in the substantially crystalline state. Accordingly, in this embodiment, memory material 130 may be adapted to be altered to one of at least two resistance values within a range of resistance values in response to an electrical signal provided using electrodes 140 and 150 so as to provide single bit or multi-bit storage of information.

Programming of memory material 130 to alter the state or phase of the material may be accomplished by applying voltage potentials to electrodes 140 and 150, thereby generating a voltage potential across memory material 130. An electrical current may flow through a portion of memory material 130 in response to the applied voltage potentials, and may result in heating of memory material 130.

This heating and subsequent cooling may alter the memory state or phase of memory material 130. Altering the phase or state of memory material 130 may alter an electrical characteristic of memory material 130. For example, the resistance of the material may be altered by altering the phase of the memory material 130. Memory material 130 may also be referred to as a programmable resistive material or simply a programmable material.

In one embodiment, a voltage potential difference of about three volts may be applied across a portion of memory material 130 by applying about three volts to electrode 150 and about zero volts to electrode 140. A current may flow through memory material 130 in response to the applied voltage potentials, and may result in heating of memory material 130. This heating and subsequent cooling may alter the memory state or phase of memory material 130.

In a "reset" state, memory material 130 may be in an amorphous or semi-amorphous state and in a "set" state, memory material 130 may be in an a crystalline or semi-crystalline state. The resistance of memory material 130 in the amorphous or semi-amorphous state may be greater than the resistance of memory material 130 in the crystalline or semi-crystalline state. It is to be appreciated that the association of reset and set with amorphous and crystalline states, respectively, is a convention and that at least an opposite convention may be adopted.

Using electrical current, memory material 130 may be heated to a relatively higher temperature to amorphisize memory material 130 and "reset" memory material 130 (e.g., program memory material 130 to a logic "0" value). Heating the volume of memory material 130 to a relatively lower crystallization temperature may crystallize memory material 130 and "set" memory material 130 (e.g., program memory material 130 to a logic "1" value). Various resistances of memory material 130 may be achieved to store information by varying the amount of current flow and duration through the volume of memory material 130.

The information stored in memory material 130 may be read by measuring the resistance of memory material 130. As an example, a read current may be provided to memory material 130 using electrodes 140 and 150, and a resulting read voltage across memory material 130 may be compared against a reference voltage using, for example, a sense amplifier (not shown). The read voltage may be proportional to the resistance exhibited by the memory cell. Thus, a higher voltage may indicate that memory material 130 is in a relatively higher resistance state, e.g., a "reset" state; and a lower voltage may indicate that the memory material 130 is in a relatively lower resistance state, e.g., a "set" state.

In one embodiment, electrode 140 may include a relatively highly resistive material and may be used as a heating element adapted to generate heat in response to electrical current passing through electrode 140. In other words, electrode 140 may include a resistive material that generates resistive heating to program memory material 130. Although not shown in FIG. 1, electrode 140 may include two layers of materials, the first layer being in contact with memory material 130 and having higher resistivity than the second layer. As an example, the resistivity of the relatively higher resistivity layer may be in the range of one to 500 milli-ohm (mohm) per centimeter (cm). In one embodiment, the higher resistivity layer may be in the 30 to 100 milli-ohm per centimeter range. The lower resistivity layer of electrode 140 may have a resistivity in the 0.01 to 1.0 milli-ohm per centimeter range, and in one embodiment, the lower resistivity layer may be in the 0.05 to 0.15 milli-ohm per centimeter range.

Examples of resistive materials- that may be used for electrode 140 may include titanium silicon nitride, tantalum nitride, or other resistive heating materials, although the scope of the present invention is not limited in this respect. The resistivity of a resistive material may be changed by altering the concentration of one or more of the elements of the alloy. Compared to a highly conductive electrode, using an electrode that includes at least two layers having different resistivity may result in current being distributed more uniformly via the electrode.

Insulating materials 160 and 165 may be electrically and thermally insulating materials. Insulating materials 160 and 165 may be referred to as an insulators.

Insulating material 160 may be formed surrounding electrode 140. For example, insulating material 160 may be formed on the outer sidewalls of electrode 140. Examples of insulating material 160 may include an oxide, nitride, or a low K dielectric material, although the scope of the present invention is not limited in this respect. In other embodiments, insulating material 160 may be an organic polymer material, a non-switching chalcogenide alloy, a xerogel material, or a material having at least two times lower thermal conductivity than an oxide material.

A xerogel may be a gel which has the liquid removed from its pores. A xerogel may result from a super critical drying process. Thus, a xerogel may be a gel dried at temperatures close to room temperature and under atmospheric pressure. The xerogel may be the result of gentle drying to avoid cracking associated with the very low permeability of the solid network. The xerogel may have at least two times lower thermal conductivity than an oxide, and in one embodiment, may have about ten or more times lower thermal conductivity than oxide.

The structure in FIG. 1 may be referred to generally as a memory cell and may also be referred to as an "oven cell." The "oven cell" structure illustrated in FIG. 1 provides a sidewall electrode, e.g., electrode 140, surrounding memory material 130 which may provide improved heating efficiency and more uniform heat delivery for phase switching of memory material 130. A highly insulating sidewall material, e.g., insulating material 160, surrounding electrode 140 may further increase heating efficiency. Insulating material 160 may prevent heat from escaping sideways or laterally from memory material 130.

Since one of the electrodes of memory element 110 surrounds a majority of memory material 130, this structure may increase heating efficiency during programming, thereby reducing programming currents. Improved heating efficiency from an "oven cell" design may enable the majority or the full volume of memory material 130 to be switched to saturated high and low resistance binary states, which may reduce the bit-to-bit variation for the high and low resistances.

In other embodiments, memory 100 may be arranged differently and include additional layers and structures. For example, it may be desirable to form isolation structures, peripheral circuitry (e.g., addressing circuitry), etc. It should be understood that the absence of these elements is not a limitation of the scope of the present invention.

FIGS. 2–13 may be used to illustrate one embodiment of the fabrication of a memory element 210. Memory element 210 may include a conductive material 220 over a semiconductor substrate (not shown). Although the scope of the present invention is not limited in this respect, conductive material 220 may be a silicided silicon material.

An electrode material 230 may be deposited overlying conductive material 220. Electrode material 230 may be a resistive electrode material and may make an ohmic contact with conductive material 220. Electrode material 230 may be a substantially planar layer of titanium nitride (TiN), titanium aluminum nitride (TiAlN), or titanium silicon nitride (TiSiN), although the scope of the present invention is not limited in this respect. In one embodiment, the resistivity of electrode material 230 may be greater than the resistivity of conductive material 220.

Electrode material 230 may be deposited using a physical vapor deposition (PVD) process. Electrode material 230 may have a thickness ranging from about 100 angstroms to about 1000 angstroms, although the scope of the present invention is not limited in this respect. In one embodiment, the thickness of electrode material 230 may be less than or equal to about 500 angstroms.

A substantially planar layer of a memory material 240 may be formed overlying electrode material 230 using, for example, a physical vapor deposition (PVD) process. In one embodiment, after depositing electrode material 230 and without breaking vacuum, memory material 240 may be sputter deposited overlying a substantially planar top surface of electrode material 230. The thickness of memory material 240 may range from about 100 angstroms to about 2000 angstroms. In one embodiment, memory material 240 may be a non-volatile, phase change material. Memory material 240 may be composed of the same or similar materials as memory material 130 (FIG. 1).

A substantially planar layer of an insulating material 250 may be formed overlying memory material 240 using, for example, a plasma enhanced chemical vapor deposition (PECVD) process. In one embodiment, after depositing memory material 240 and without breaking vacuum, insulating material 250 may be deposited overlying a substantially planar top surface of memory material 240 to seal memory material 240. The thickness of insulating material 250 may range from about 200 angstroms to about 3000 angstroms. In one embodiment, insulating material 250 may be silicon nitride, although the scope of the present invention is not limited in this respect.

Figure 2:
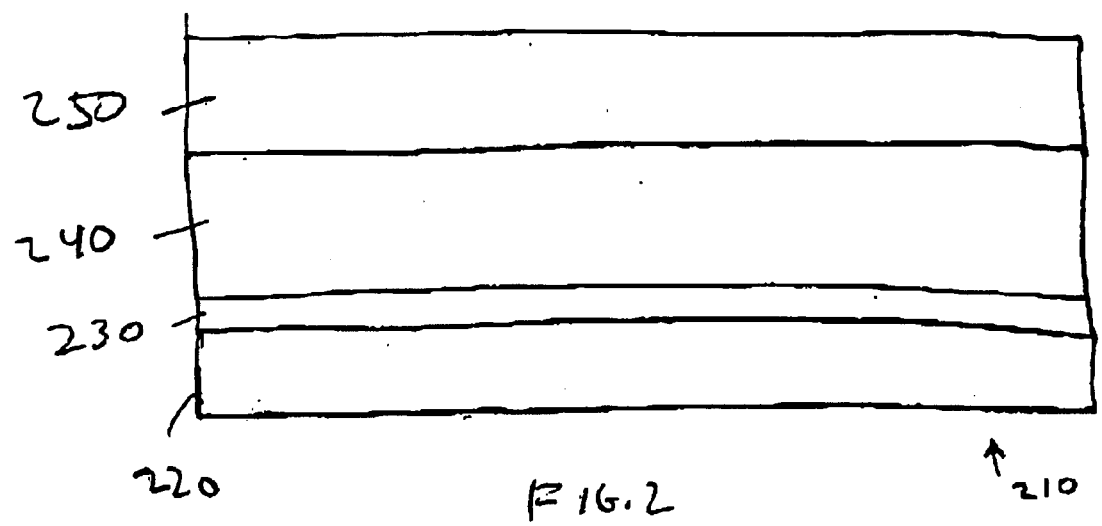
FIG. 2 is a cross-sectional view of a portion of a memory element during fabrication in accordance with an embodiment of the present invention.

In the embodiment shown in FIG. 2, conductive material 220, electrode material 230, memory material 240, and insulating material 250 may form a planarized stack, wherein memory material 240 is a substantially planar layer formed overlying a substantially planar top surface of a single layer of an electrode material (e.g., 230). Electrode material 230 may form an ohmic contact with memory material 240.

Figure 3:
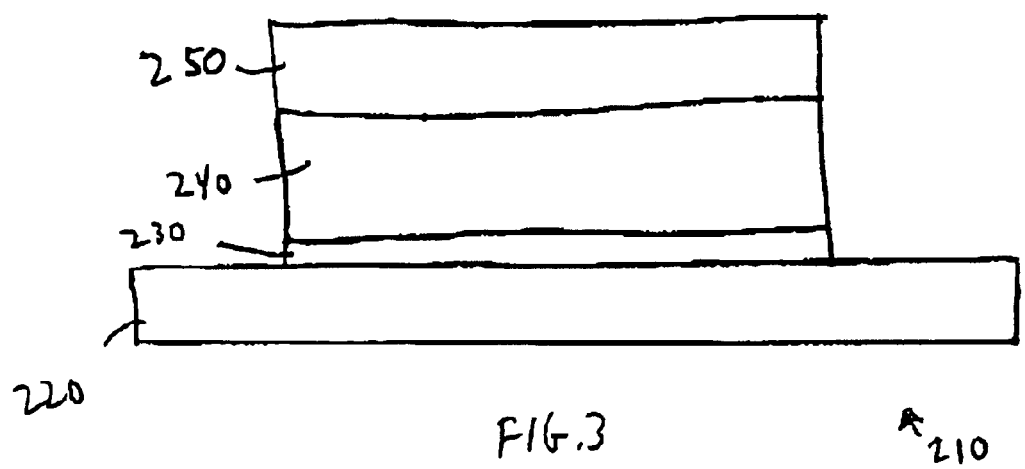
FIG. 3 is a cross-sectional view of the structure of FIG. 2 at a later stage of fabrication.

FIG. 3 illustrates the structure shown in FIG. 2 after removing portions of materials 230, 240, and 250 using, for example, photolithographic and etch techniques. As an example, portions of materials 230, 240, and 250 may be removed by applying a layer of photoresist material (not shown) on insulating material 250 and exposing this photoresist material to light. A mask (not shown) may be used to expose selected areas of the photoresist material, which defines areas to be removed. The etch may be a chemical etch, which may be referred to as a wet etch. Or, the etch may be an electrolytic or plasma (ion bombardment) etch, which may be referred to as a dry etch.

Figure 4:
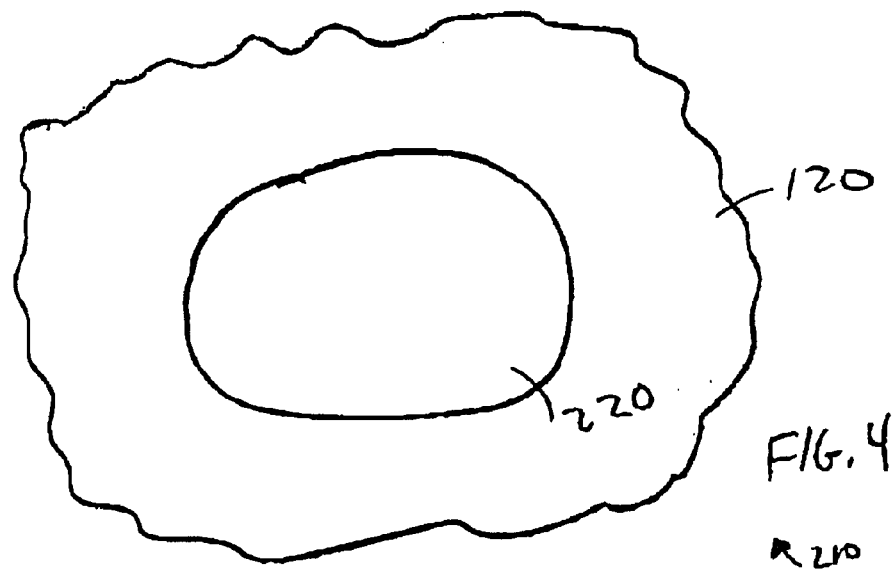
FIG. 4 is a top view of the structure of FIG. 3 at the stage of fabrication illustrated in FIG. 3.

Materials 230, 240, and 250 may be patterned to form various structures such as, for example, a cylinder-shaped or circular disk-shaped structure. FIG. 4 is a top view of the structure illustrated in FIG. 3 showing that the structure has a cylinder or circular disk shape, although the scope of the present invention is not limited in this respect. In other embodiments, materials 230, 240, and 250 may be patterned to form structures such as, for example, a rectangular or oval structure.

Figure 5:
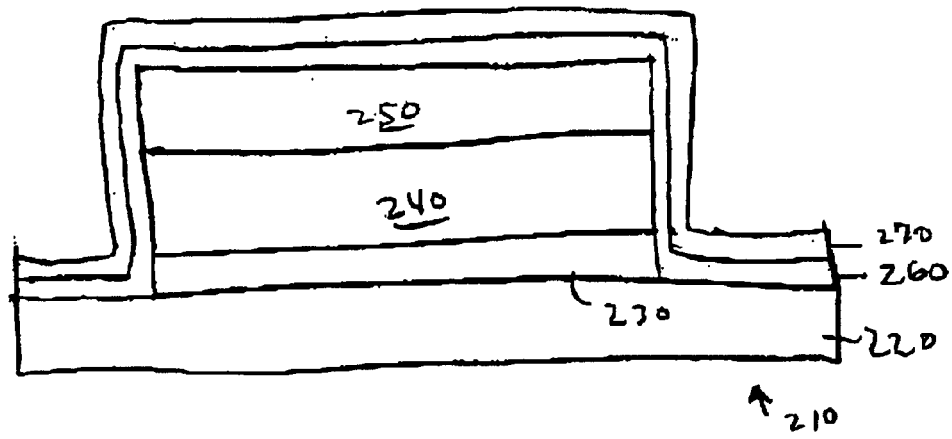
FIG. 5 is a cross-sectional view of the structure of FIG. 3 at a later stage of fabrication.

FIG. 5 illustrates the structure of FIG. 3 after depositing a relatively high resistivity electrode material 260 overlying the top and sidewall surfaces of the cylinder-shaped stack illustrated in FIGS. 3 and 4. A relatively low resistivity electrode material 270 may be deposited overlying electrode material 260.

Electrode materials 260 and 270 may be electrically conductive materials. Examples of materials that may be used for electrode materials 260 and 270 may include titanium nitride (TiN), titanium aluminum nitride (TiAlN), or titanium silicon nitride (TiSiN), or other resistive heating materials, although the scope of the present invention is not limited in this respect. The resistivity of these materials may be changed by altering the concentration of one or more of the elements of the alloy.

Although the scope of the present invention is not limited in this respect, electrode materials 260 and 270 may be deposited using, for example, a CVD process, to surround and encapsulate the cylinder-shaped stack. Electrode material 260 may have a thickness of about 100 angstroms to 1000 angstroms and electrode material 270 may have a thickness of about 300 angstroms, although the scope of the present invention is not limited in this respect.

Figure 6:
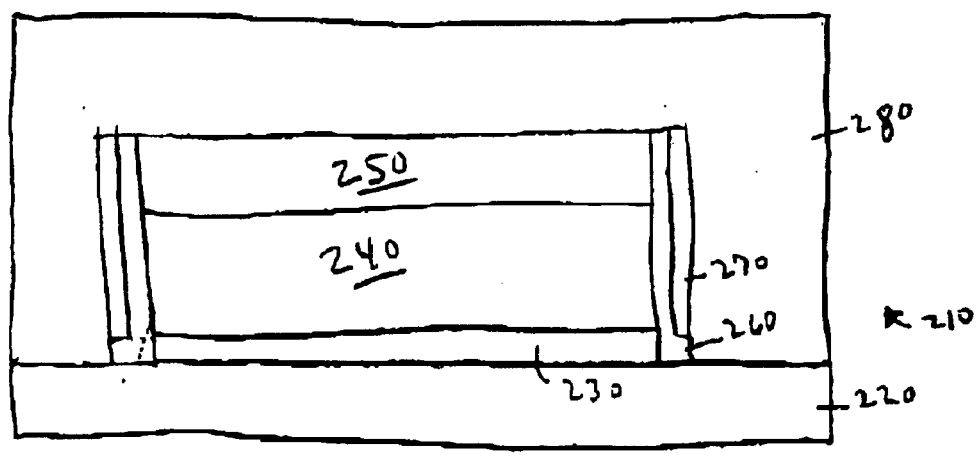
FIG. 6 is a cross-sectional view of the structure of FIG. 5 at a later stage of fabrication.

FIG. 6 illustrates the structure of FIG. 5 after depositing an insulating material 280 surrounding the cylinder-shaped stack. Prior to the deposition of material 280 a spacer etch may be performed to segment materials 260 and 270 to only the sidewalls of the cylindrical structure but removing materials 260 and 270 from the regions between one memory cell and a neighboring memory cell and removing materials 260 and 270 from the top surface of material 250.

Insulating material 280 may be deposited using, for example, a high temperature plasma (HTP) process. In one embodiment, insulating material 280 may be an oxide material. Insulating material 280 may have a thickness ranging from about 2000 angstroms to about 6000 angstroms, although the scope of the present invention is not limited in this respect.

Figure 7:
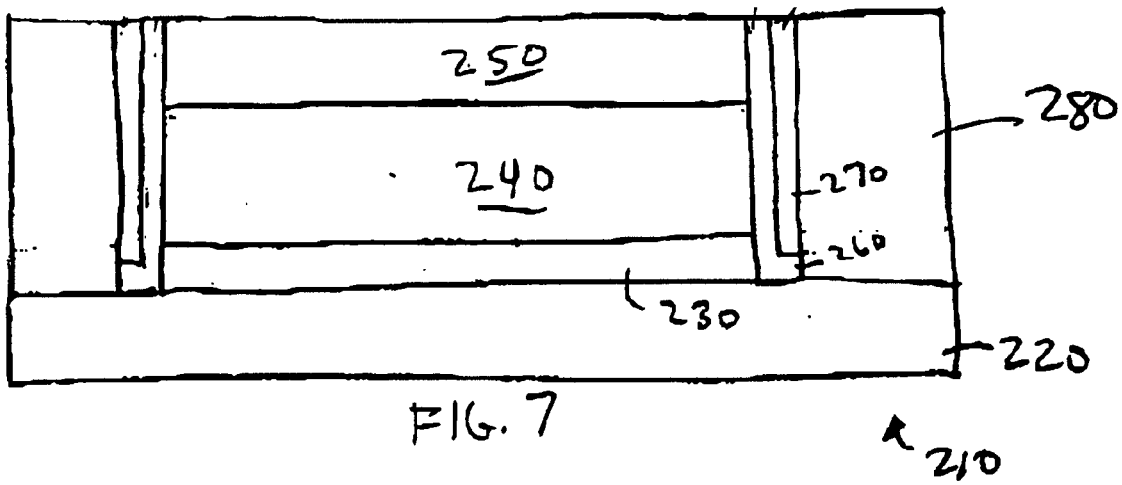
FIG. 7 is a cross-sectional view of the structure of FIG. 6 at a later stage of fabrication.

FIG. 7 illustrates the structure of FIG. 6 after removing portions of material 280 and possibly materials 250, 260, and 270 using, for example, an etch back process. The structure in FIG. 6 may be planarized to form a substantially planar or level top surface. Suitable planarization techniques may include a chemical or chemical-mechanical polish (CMP) technique.

Figure 8:
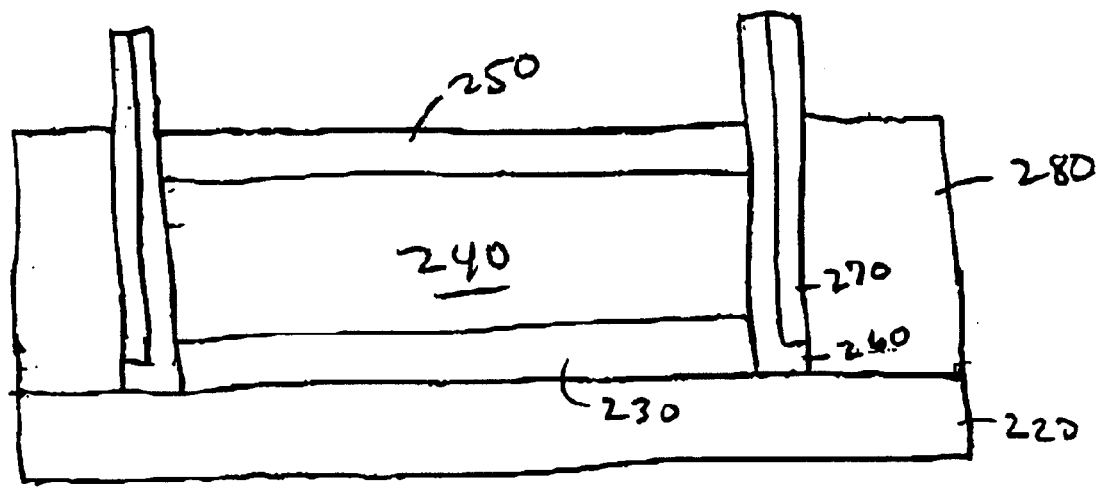
FIG. 8 is a cross-sectional view of the structure of FIG. 7 at a later stage of fabrication.

FIG. 8 illustrates the structure shown in FIG. 7 after the removal of portions of materials 250 and 280 using, for example, a selective etch technique. After the selective etch, a ring of electrode material, e.g., 260 and 270, may protrude from the top surface of the structure. This ring of electrode material may be used to form spacers within the ring.

Figure 9:
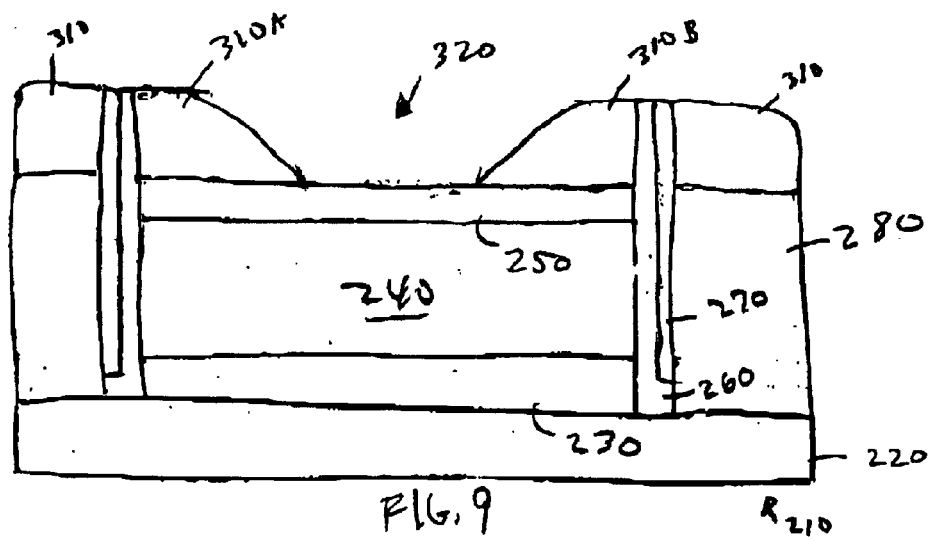
FIG. 9 is a cross-sectional view of the structure of FIG. 8 at a later stage of fabrication.

FIG. 9 illustrates the structure shown in FIG. 8 after forming spacers 310A and 310B. Spacers 310A and 310B may be formed by depositing a layer of an insulating material 310 over the structure shown in FIG. 7. This layer of material 310 may be patterned to form spacers 310A and 310B within the inner sidewalls of electrode material 260. Material 310 may be PECVD or PECVD TetraEthylOrthoSilicate (TEOS) oxides.

Spacers 310A and 310B may be referred to as sidewall spacers and the distance between sidewall spacers 310A and 310B may be sub-lithographic. In other words, an opening 320 having a sub-lithographic diameter may be formed between sidewall spacers 310A and 310B. In one embodiment, the distance between spacers 310A and 310B may be less than about 1000 angstroms, although the scope of the present invention is not limited in this respect. During the patterning of material 310 to form spacers 310A and 310B, an anisotropic etch may be used to form spacers 310A and 310B, wherein the etch may use an etching agent that is selective such that the etching agent stops at, or preserves, insulating material 250.

Figure 10:
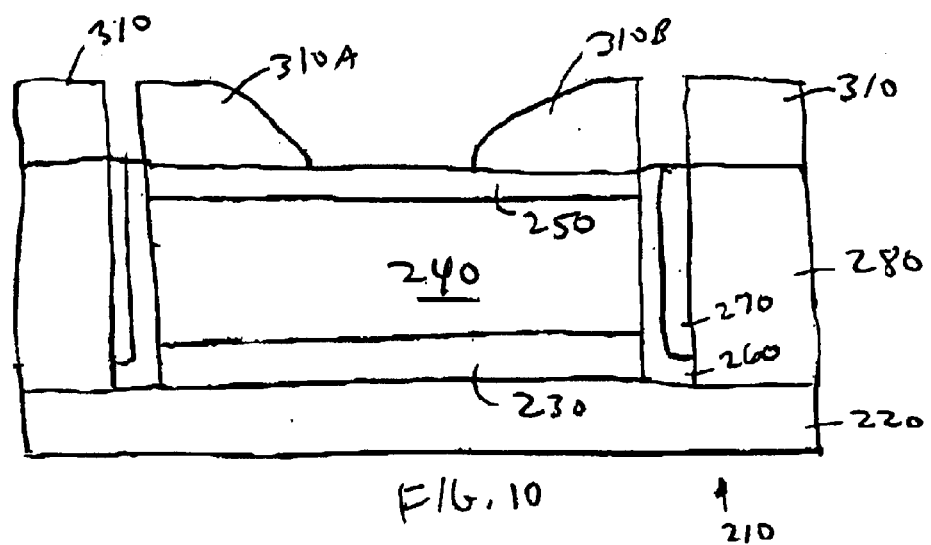
FIG. 10 is a cross-sectional view of the structure of FIG. 9 at a later stage of fabrication.

FIG. 10 illustrates the structure of FIG. 9 after removing portions of electrode materials 260 and 270. A selective etch may be used to remove the upper portions of electrode materials 260 and 270. This may be done to electrically isolate the bottom or lower electrode of memory element 210 from the top or upper electrode.

Figure 11:
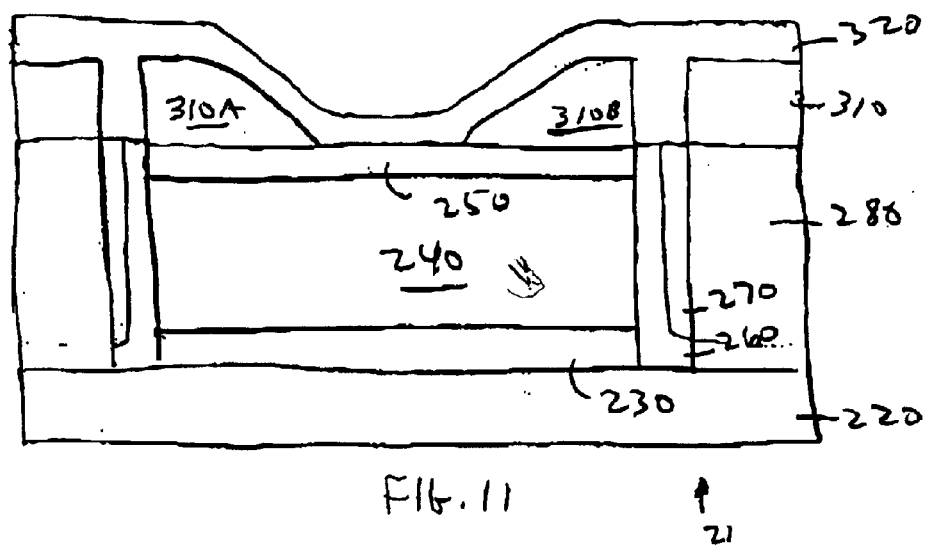
FIG. 11 is a cross-sectional view of the structure of FIG. 10 at a later stage of fabrication.

FIG. 11 illustrates the structure of FIG. 10 after depositing another spacer material 320 using, for example, a PECVD process. Although the scope of the present invention is not limited in this respect, spacer material 320 may be an oxide. Spacer material 320 may be used to provide electrical isolation between the lower and upper electrodes of memory element 210.

Figure 12:
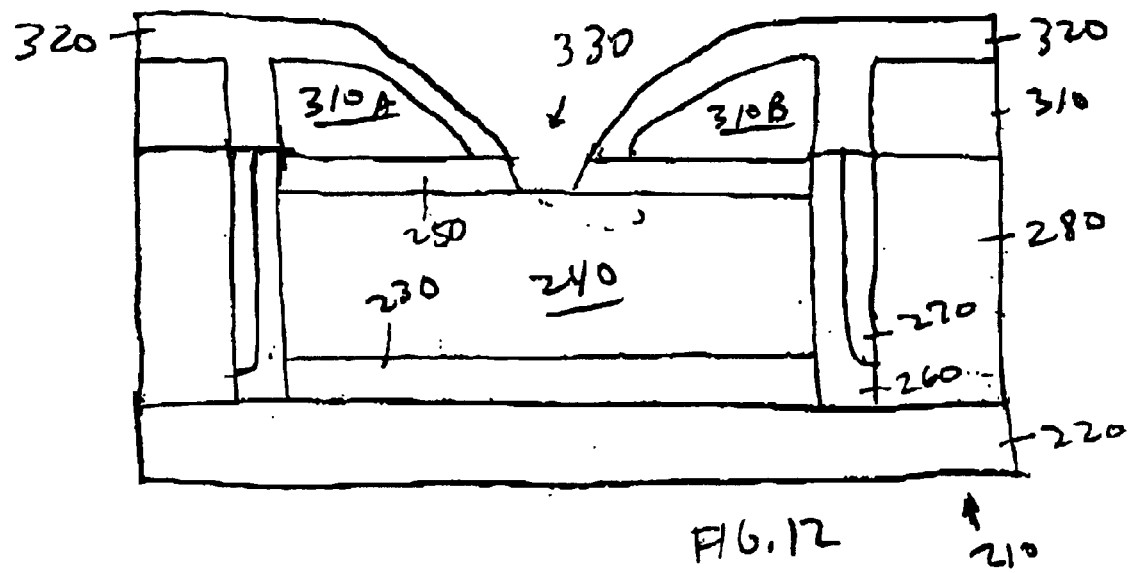
FIG. 12 is a cross-sectional view of the structure of FIG. 11 at a later stage of fabrication.

FIG. 12 illustrates the structure of FIG. 11 after removing portions of spacer material 320 and insulating material 250 using, for example, a punch through etch. After the etch, an opening 330 having a sub-lithographic diameter may be formed, wherein a portion of the top surface of memory material 240 is exposed. In one aspect, spacers 310A, 310B, and 320 may serve to reduce the quantity of top electrode material (e.g., 340 shown in FIG. 12) contacting memory material 240.

Materials 250, 280, 310, and 320 may form an electrically and thermally insulating structure having an opening to expose memory material 240, wherein a conductive material (e.g., 340 shown in FIG. 12) may contact memory material 240 through the opening.

Figure 13:
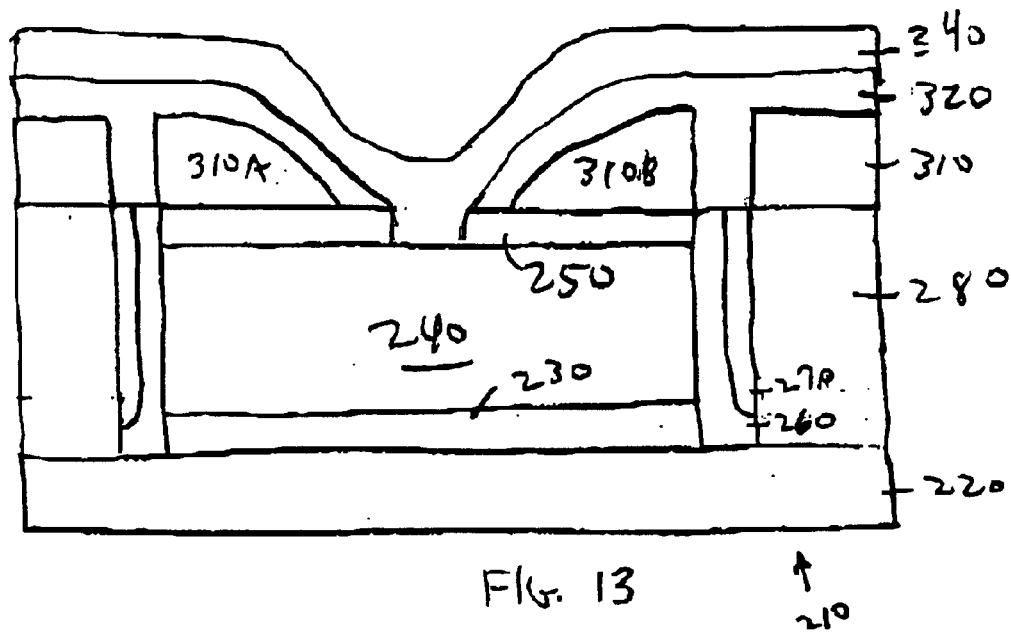
FIG. 13 is a cross-sectional view of the structure of FIG. 12 at a later stage of fabrication.

FIG. 13 illustrates the structure shown in FIG. 12 after the deposition of an electrode material 340 using, for example, a PVD or CVD process. Electrode material 340 may be TiSiN or TiAlN.

Memory element 210 may be referred to as an "oven cell" structure. Materials 230, 260, and 270 may form a lower electrode of memory element 210 that surrounds and contacts bottom and lateral surfaces of memory material 240. Electrode material 340 may form an upper electrode of memory element 210. Conductive material 220 may be an address line. Materials 250, 280 310, and 320 may be electrically and thermally insulating materials that electrically isolate and physically separate the lower and upper electrodes of memory element 210.

FIGS. 14–22 may be used to illustrate another embodiment of the fabrication of a memory element 610. Memory element 610 may include an insulating material 620, e.g., an oxide, overlying a substrate 630. Substrate 630 may be silicon substrate, although the scope of the present invention is not limited in this respect. In one embodiment, substrate 630 may be silicided silicon, and insulating layer 620 may have a thickness of less than about 2000 angstroms.

Figure 14:
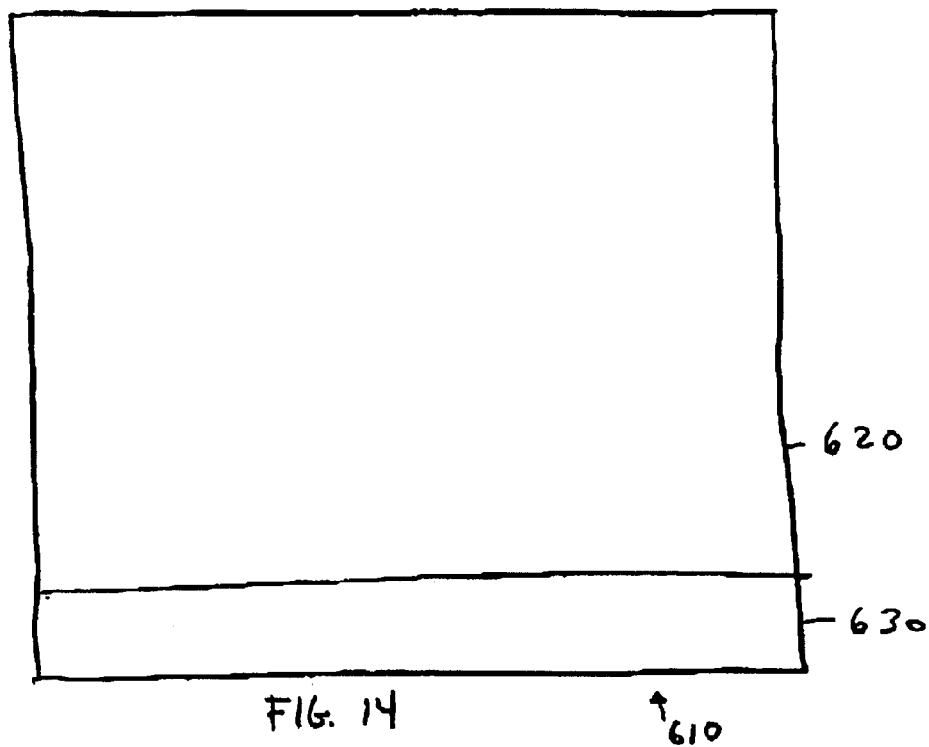
FIG. 14 is a cross-sectional view of a portion of a memory element during fabrication in accordance with an embodiment of the present invention.
Figure 15:
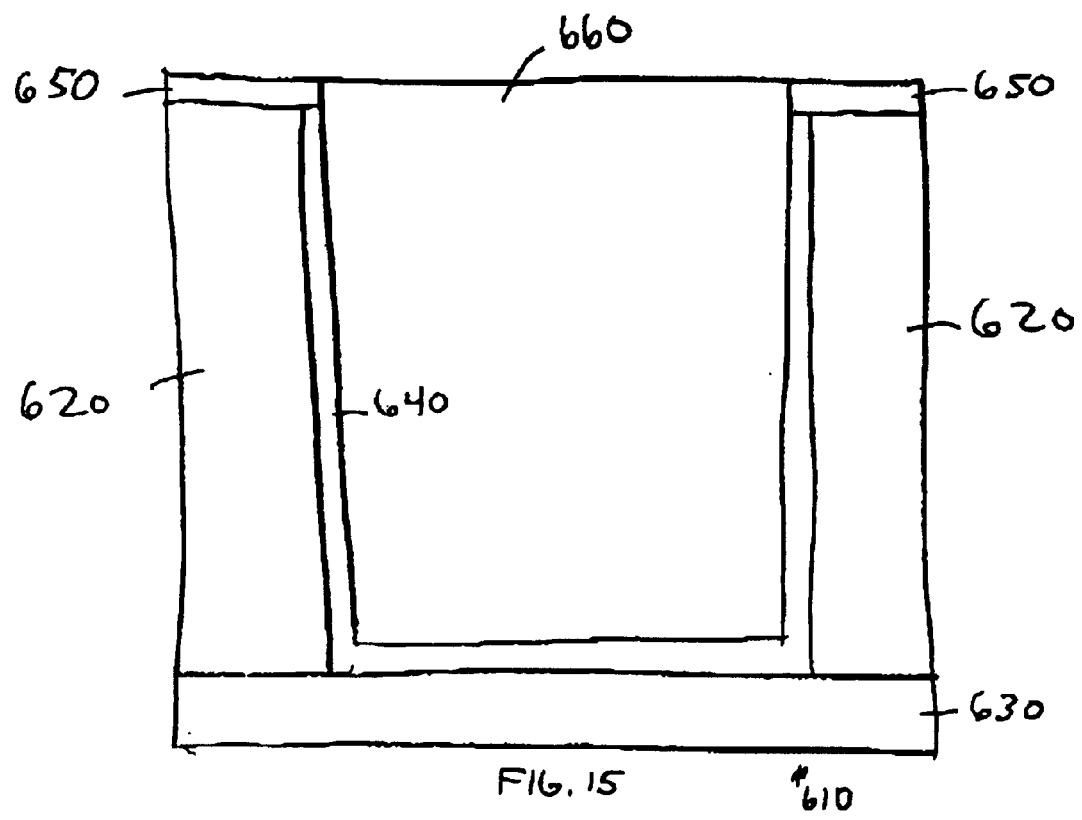
FIG. 15 is a cross-sectional view of the structure of FIG. 14 at a later stage of fabrication.

FIG. 15 illustrates the structure shown in FIG. 14 after forming an opening in insulating material 620 using, for example, photolithographic and etch techniques. A conductive liner 640, e.g., a tungsten liner, may be deposited along the sidewalls of the opening and along the bottom of the opening so that conductive liner 640 may contact substrate 630.

In one embodiment, the opening in insulating material 620 may be formed using photolithographic and etch techniques. As an example, the opening may be formed by applying a layer of photoresist material (not shown) on insulating material 620 and exposing this photoresist material to light. A mask (not shown) may be used to expose selected areas of the photoresist material, which defines areas to be removed, i.e., etched. If the opening is formed using photolithographic techniques, the diameter or width of the opening may be at least one minimum feature size.

The minimum feature size of a structure may refer to the minimum dimension achievable using photolithography. For example, the minimum feature size may refer to a width of a material or spacing of materials in a structure. As is understood, photolithography refers to a process of transferring a pattern or image from one medium to another, e.g., as from a mask to a wafer, using a certain wavelength or wavelengths of light. The minimum feature size of the transferred pattern that is available in integrated circuit (IC) manufacturing may be limited by the limitations of the wavelength of the light source. Distances, sizes, or dimensions less than the minimum feature size may be referred to as sub-lithographic distances, sizes, or dimensions. For example, some photolithographic processes may have minimum feature sizes of about 2500 angstroms. In this example, a sub-lithographic distance may refer to a feature having a width of less than about 2500 angstroms.

Several techniques may be used to achieve sub-lithographic dimensions. Although the scope of the present invention is not limited in this respect, phase shift mask, electron beam lithography, or x-ray lithography may be used to achieve sub-lithographic dimensions. Electron beam lithography may refer to a direct-write lithography technique using a beam of electrons to expose resist on a wafer. X-ray lithography may refer to an advanced lithographic process for transferring patterns to a silicon wafer in which the electromagnetic radiation used is X-ray, rather than longer wavelength radiation. The shorter wavelength for X-rays (e.g., about 10–200 angstroms, versus about 2000–3000 angstroms for ultra-violet radiation) may reduce diffraction, and may be used to achieve feature sizes of about 1000 angstroms and less. Also, sidewall spacers may be used to achieve sub-lithographic dimensions.

An etch stop layer 650 that may be used in a subsequent etch operation may be formed overlying insulating material 620. In one embodiment, etch stop layer 650 may be a hard mask material, e.g., a nitride, having a thickness of less than about 1000 angstroms. An insulating material 660, e.g., an oxide, may be deposited using, for example, a high denisty plasma (HDP) process. Insulating material 660 may be formed overlying conductive liner 640. A CMP process may be used to planarize the structure as shown in FIG. 15.

Figure 16:
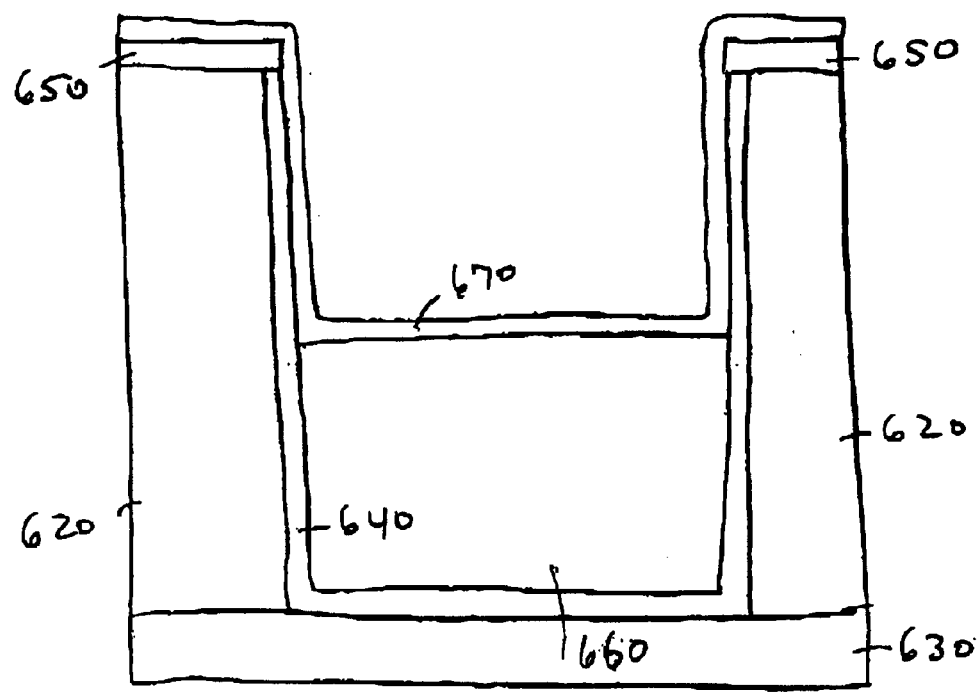
FIG. 16 is a cross-sectional view of the structure of FIG. 15 at a later stage of fabrication.

FIG. 16 illustrates the structure shown in FIG. 16 after removing a portion of insulating material 660. In one embodiment, approximately half of insulating material 660 may be removed using, for example, an etch operation. A conductive material 670 may be deposited overlying etch stop layer 650, along a portion of conductive liner 640, and overlying insulating material 660. In one embodiment, conductive material 670 may composed of tungsten and may have a thickness of less than about 200 angstroms.

Figure 17:
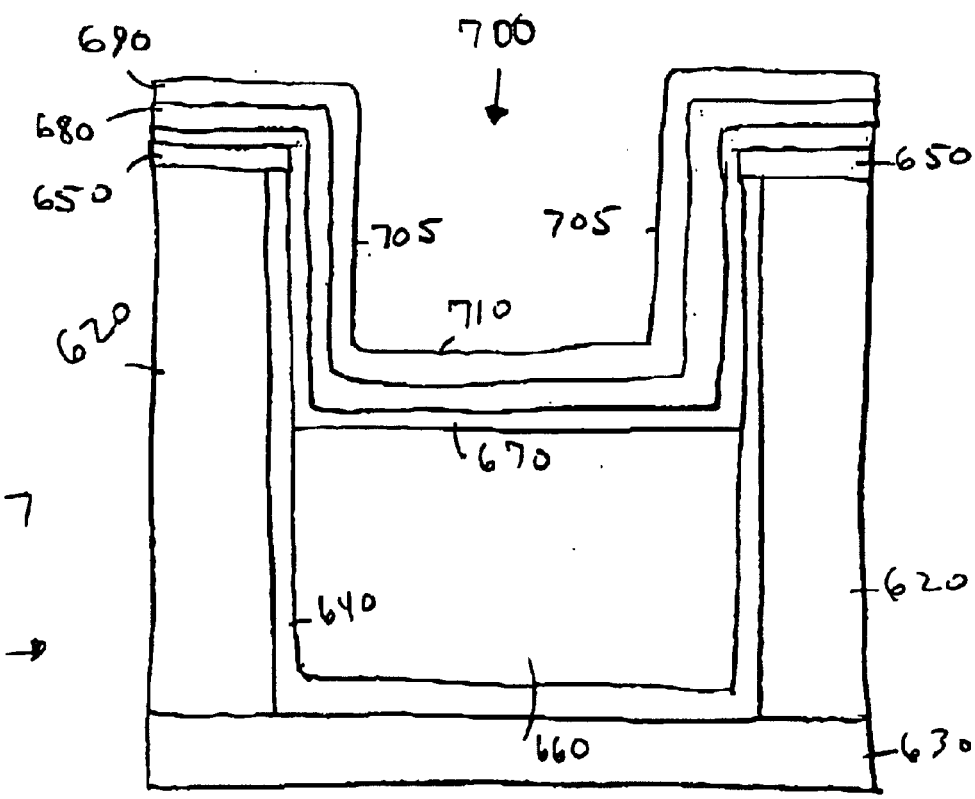
FIG. 17 is a cross-sectional view of the structure of FIG. 16 at a later stage of fabrication.

FIG. 17 illustrates the structure shown in FIG. 16 after depositing electrode materials 680 and 690 over conductive material 670 to form an opening 700. Opening 700 has sidewalls 705 and a bottom defined by material 690. In other words, electrode 690 may be cup-shaped having an interior portion that defines an opening 700 having a diameter.

Material 690 may be a relatively high resistivity electrode material and material 680 may be a relatively low resistivity material. Although the scope of the present invention is not limited in this respect, electrode materials 680 and 690 may be deposited using, for example, a CVD process. The thickness of material 680 may be less than about 2000 angstroms and the thickness of material 690 may be less than about 2000 angstroms, although the scope of the present invention is not limited in this respect.

Electrode materials 680 and 690 may be electrically conductive materials. Examples of materials that may be used for electrode materials 680 and 690 may include titanium nitride (TiN), titanium aluminum nitride (TiAlN), or titanium silicon nitride (TiSiN), or other resistive heating materials, although the scope of the present invention is not limited in this respect. The resistivity of these materials may be changed by altering the concentration of one or more of the elements of the alloy.

Figure 18:
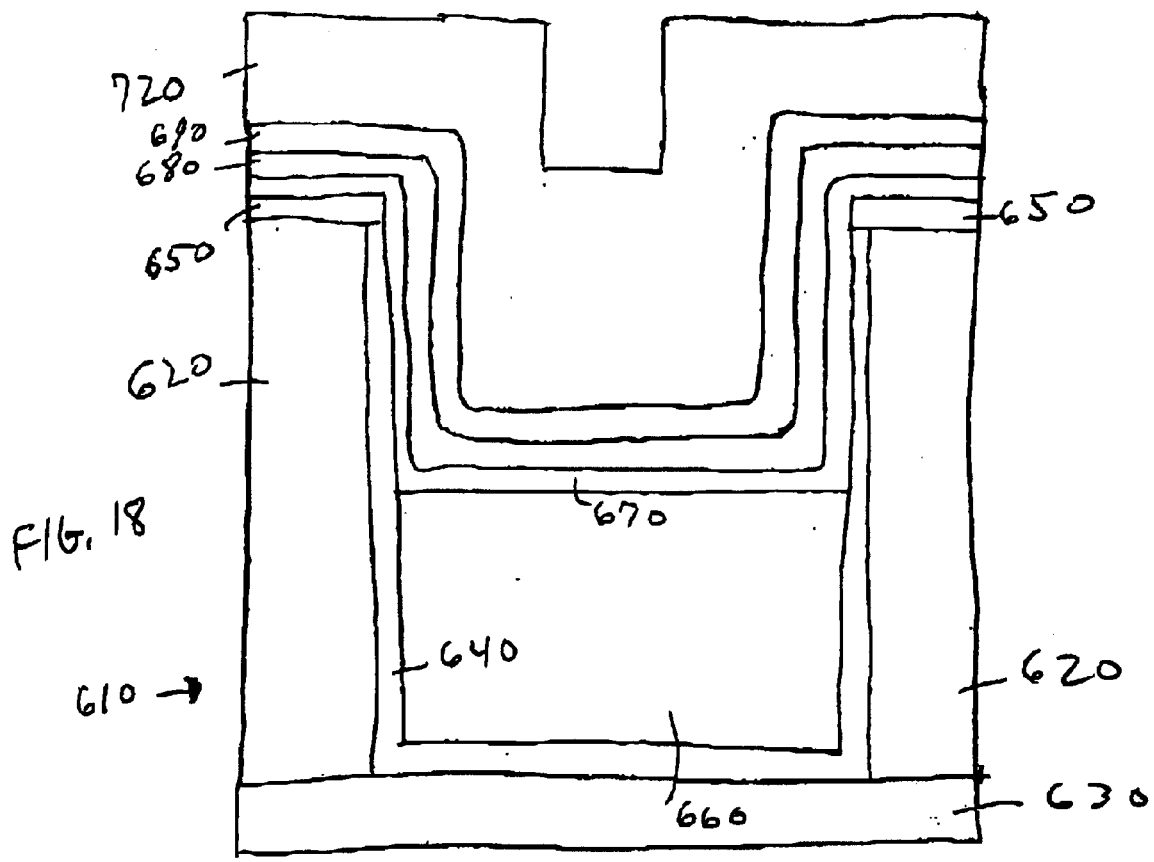
FIG. 18 is a cross-sectional view of the structure of FIG. 17 at a later stage of fabrication.

FIG. 18 illustrates the structure shown in FIG. 17 after depositing a memory material 720 overlying electrode material 690 using, for example, a physical vapor deposition (PVD) process. In one embodiment, memory material 720 may be sputter deposited overlying electrode material 690, wherein memory material 720 is formed by depositing memory material 720 within the opening defined by cup-shaped electrode 690. As may be appreciated, if insulating material 620 was segmented using photolithography, the diameter of the opening defined by cup-shaped electrode 690 may be about one minimum feature size. In this embodiment, memory material 740 is being deposited into a litho-sized opening or hole having a diameter of at least about one minimum feature size. Using this approach, the adhesion between memory material 740 and electrode material 690 may be increased. As an example, the diameter of opening 700 (FIG. 17) may be less than about 2500 angstroms.

In an alternate embodiment, another electrode material, e.g., TiSiN layer (not shown), may be formed in the opening defined by memory material 720. In one embodiment, memory material 720 may be a non-volatile, phase change material. Memory material 720 may be composed of the same or similar materials as memory material 130 (FIG. 1).

Figure 19:
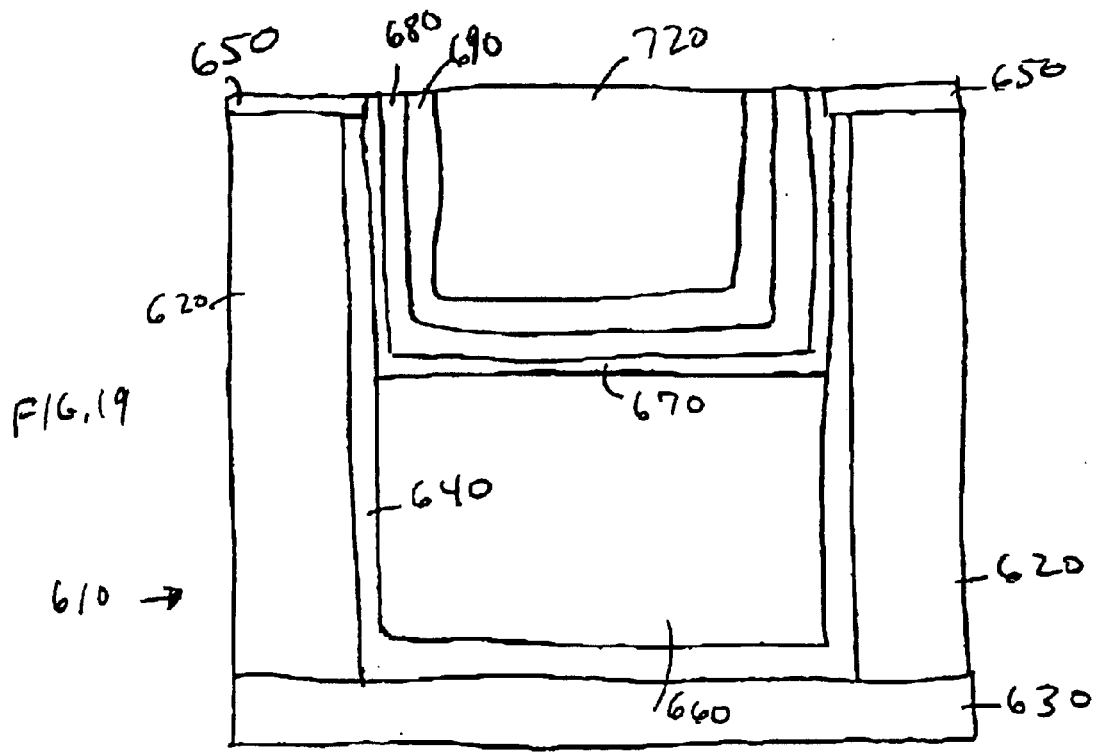
FIG. 19 is a cross-sectional view of the structure of FIG. 18 at a later stage of fabrication.

FIG. 19 illustrates the structure shown in FIG. 18 after removing portions of materials 670, 680, 690, and 720. The structure in FIG. 18 may be planarized using, e.g., a CMP, and stopping on the etch stop layer 650. In one embodiment, at this stage of fabrication, the height of the structure may be approximately equal to 2000 angstroms above the surface of substrate 630.

Figure 20:
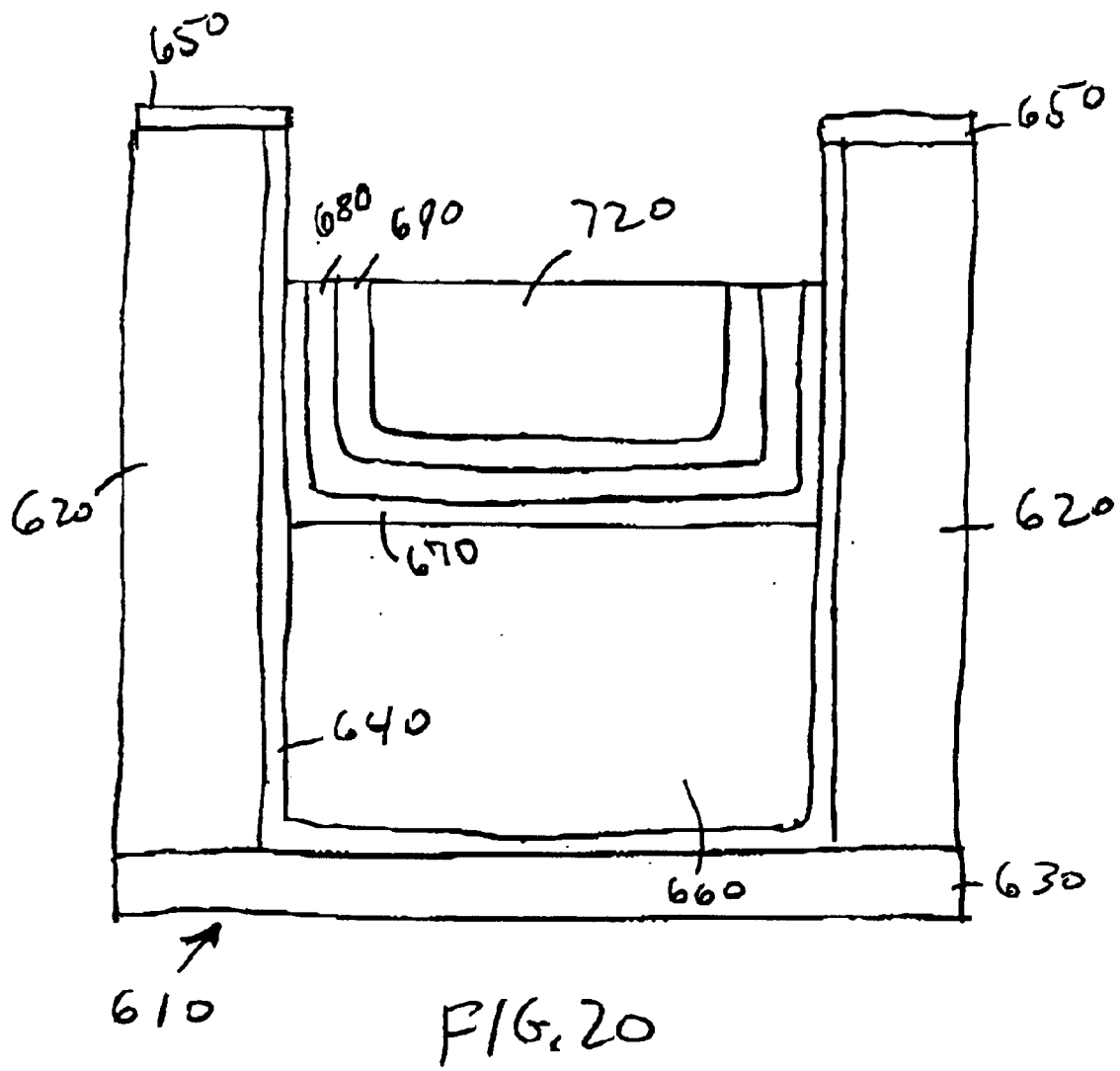
FIG. 20 is a cross-sectional view of the structure of FIG. 19 at a later stage of fabrication.

FIG. 20 illustrates the structure shown in FIG. 19 after removing portions of materials 640, 670, 680, 690, and 720. In one embodiment, with layer 650 in place, approximately half of the structure above the bottom portion of material 670 may be removed using, for example, an etch or a selective backsputter.

Figure 21:
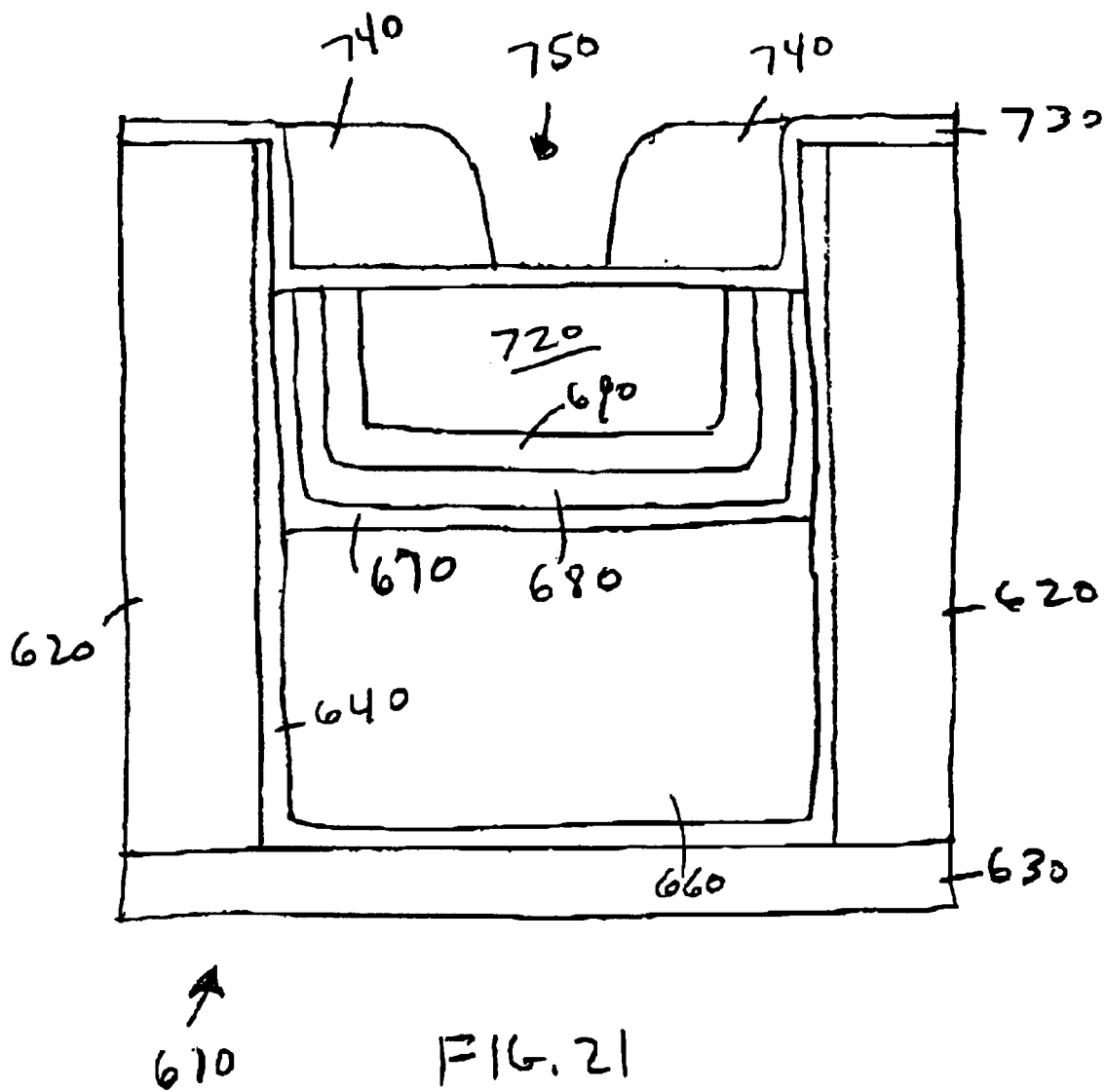
FIG. 21 is a cross-sectional view of the structure of FIG. 20 at a later stage of fabrication.

FIG. 21 illustrates the structure shown in FIG. 20 after depositing a sealing layer 730, e.g., a layer of silicon nitride (SiN). Etch stop layer 650 (shown in FIG. 20) may be removed prior to depositing sealing layer 730. Spacers 740 may be formed to define an opening 750.

In one embodiment, the diameter of opening 750 may be sub-lithographic, i.e., the distance between spacers 740 may be sub-lithographic, e.g., between about 500 angstroms to about 1000 angstroms. Spacers may be formed without using a mask, and only an etch. In another embodiment, opening 740 may be formed using photolithographic and etch techniques. If opening 740 is formed using photolithographic techniques, the diameter or width of opening 740 may be at least one minimum feature size.

Sealing layer 730 may protect memory material 720 during forming spacers 740, e.g., during a spacer etch process used to form spacers 740. The spacer etch may stop on sealing layer 730. In one aspect, spacers 740 may serve to reduce the quantity of top electrode material (e.g., 760 shown in FIG. 22) contacting memory material 720.

Figure 22:
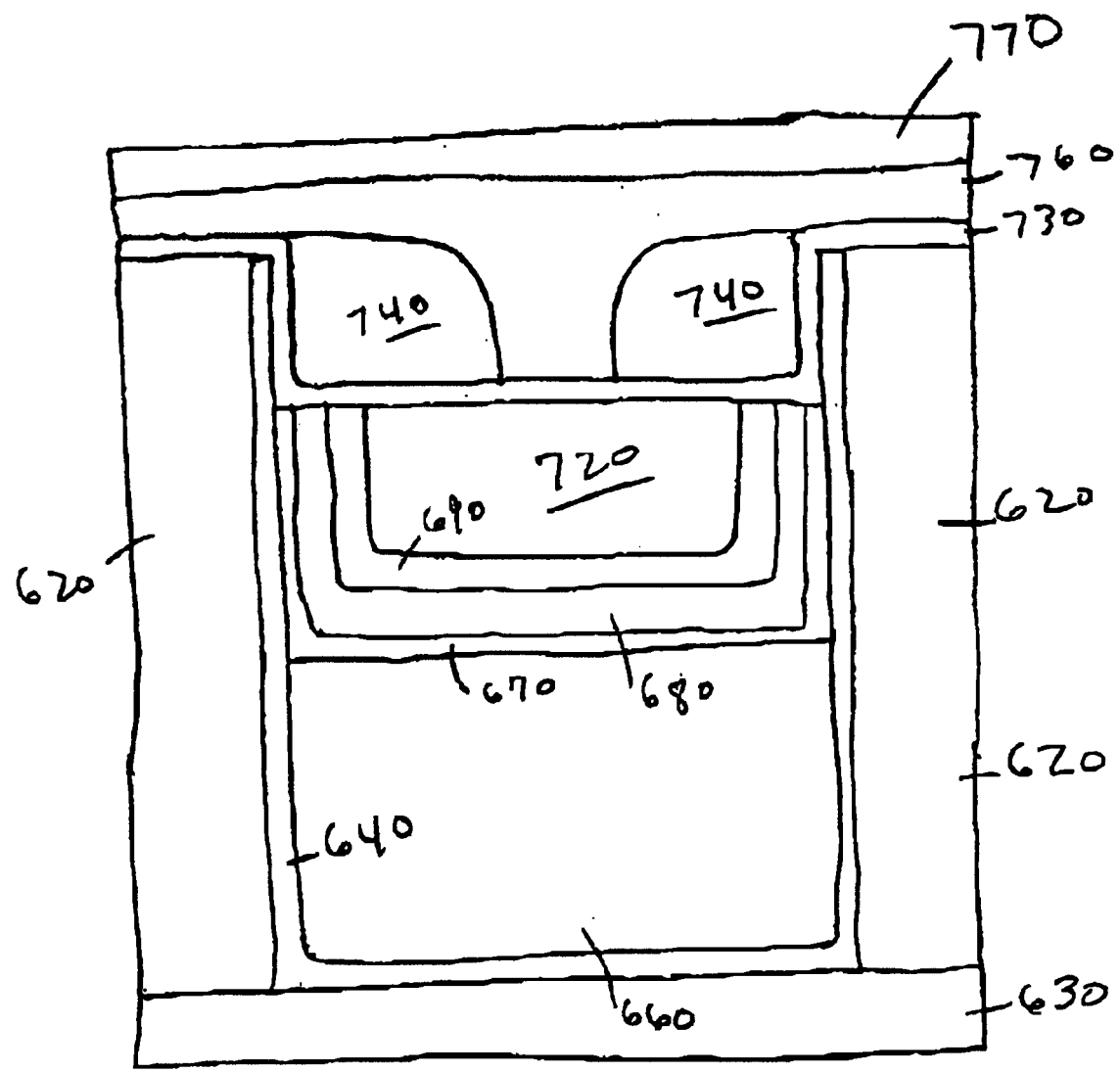
FIG. 22 is a cross-sectional view of the structure of FIG. 21 at a later stage of fabrication.

FIG. 22 illustrates the structure shown in FIG. 21 after removing a portion of sealing layer 730 using, for example, a punch through etch, to expose a portion of the top surface of memory material 720. An electrode material 760 may be deposited overlying and between spacers 740 and contacting a portion of the top surface of memory material 720. Electrode material 760 may fill opening 750 (FIG. 21) between spacers 740. In one embodiment, electrode material 760 may be TiSiN. A conductive layer 770 may be deposited overlying electrode material 760.

Memory element 610 may be referred to as an "oven cell" structure. Materials 640, 670, 680, and 690 may form a lower electrode of memory element 610 that surrounds and contacts bottom and lateral surfaces of memory material 720. The lower electrode of memory element 610 may be coupled to an address line. Electrode material 760 may form an upper electrode of memory element 610. Conductive material 770 may be an address line connected to the upper electrode of memory element 610 and electrically coupled to memory material 720 via the upper electrode. Materials 620, 730, and 740 may be electrically and thermally insulating materials that electrically isolate and physically separate the lower and upper electrodes of memory element 610.

In some embodiments, the structures described herein may reduce the processing steps and critical mask layers used for conventional process flows. Thus, some embodiments of the present invention may exhibit lower costs through fewer masking processes. For example, in the embodiment for making memory element 610 discussed with reference to FIGS. 14–22, this "oven cell" structure may be achieved using only two mask processes, i.e., one mask may be used to segment insulating material 620 prior to deposition of conductive liner 640 (e.g., see FIG. 15) and another mask may be used to pattern conductive material 770 to form several addressing lines. In this embodiment, less than there masks, e.g., only two masks, may be used, although the scope of the present invention is not limited in this respect. A mask may refer to any type of structure (e.g., hard mask, photomask, etc.) used during patterning, defining images or geometrical shapes during the processing of memory element 610.

Figure 23:
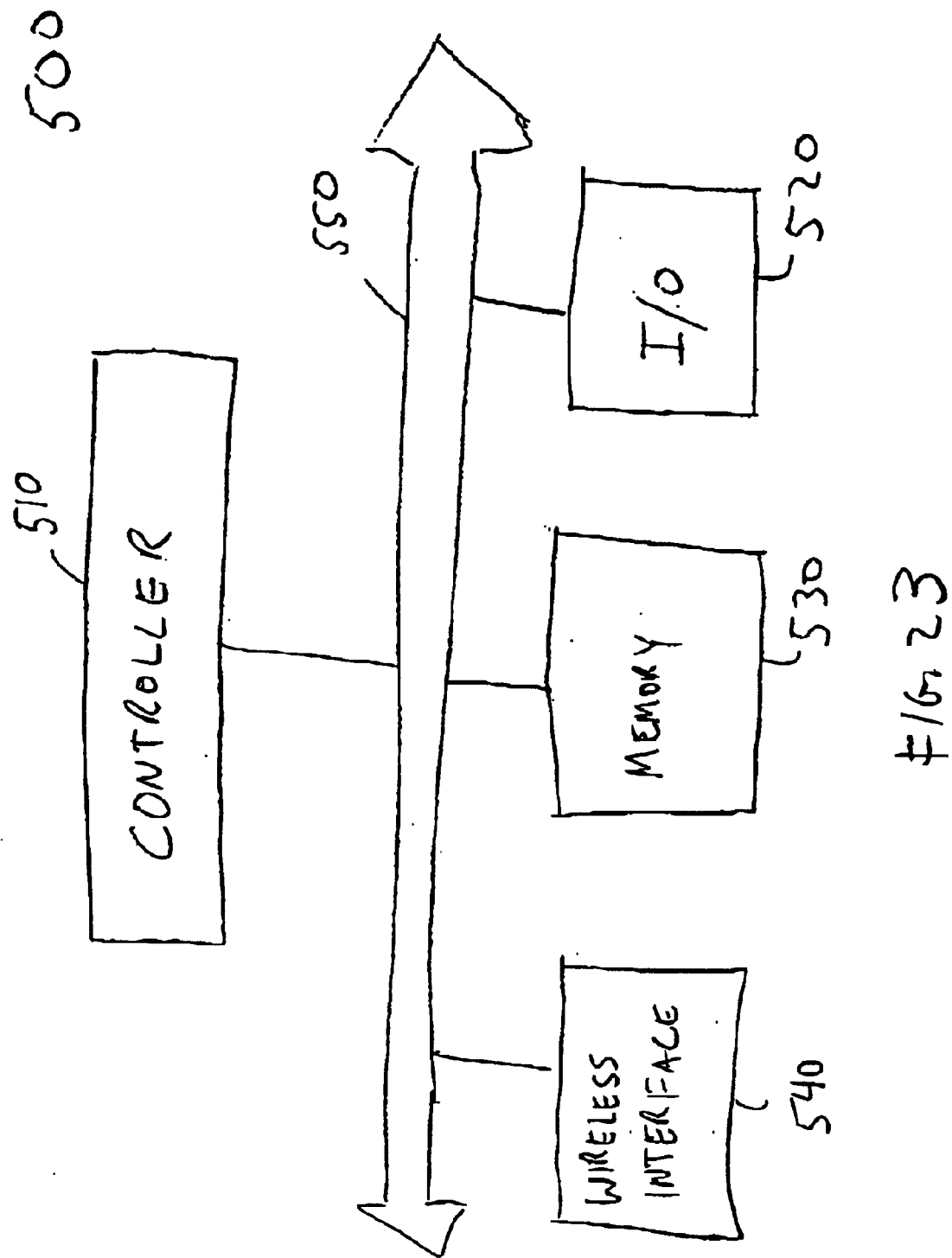
FIG. 23 is a block diagram illustrating a portion of a system in accordance with an embodiment of the present invention.

Turning to FIG. 23, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory and/or a phase change memory that includes a memory element such as, for example, memory elements 110, 210, or 610 illustrated in FIGS. 1, 13, and 22 respectively.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

Although the scope of the present invention is not limited in this respect, system 500 may use one of the following communication air interface protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus, comprising:
   a phase change material having a bottom portion, a top portion, and a lateral portion extending from the bottom portion to the top portion;
   a first electrode material contacting the bottom portion and the lateral portion of the phase change material; and
   a second electrode material contacting the top portion of the phase change material.

2. The apparatus of claim 1, wherein the first electrode material is cup-shaped and surrounds the bottom portion and the lateral portion of the phase change material.

3. The apparatus of claim 1, wherein the first electrode material is a heating element adapted to generate heat in response to electrical current passing through the first electrode material.

4. The apparatus of claim 1, wherein the first electrode material is a nitride material.

5. The apparatus of claim 1, wherein the first electrode material includes a first and second layer, the first layer being in contact with the phase change material and having higher resistivity than the second layer.

6. The apparatus of claim 1, further comprising a thermally insulating material surrounding the first electrode material.

7. The apparatus of claim 6, wherein the insulating material is selected from the group consisting of an organic polymer material, a non-switching chalcogenide alloy, an oxide material, a xerogel material, and a material having at least two times lower thermal conductivity than an oxide material.

8. The apparatus of claim 1, further comprising an insulating material on the top portion of the phase change material, wherein the insulating material has an opening and wherein the second electrode material contacts the phase change material through the opening and wherein the first electrode material is separated from the second electrode material by the insulating material.

9. The apparatus of claim 1, wherein the phase change material is cylinder-shaped.

10. The apparatus of claim 1, wherein the phase change material is a substantially planar layer deposited using a planar deposition overlying a planar surface of the first electrode material.

11. The apparatus of claim 1, wherein the phase change material is capable of being programmed into one of at least two memory states by applying an electrical signal to the phase change material using the first and second electrode materials to alter the phase of the phase change material between a substantially crystalline state and a substantially amorphous state, wherein a resistance of the memory material in the substantially amorphous state is greater than the resistance of the memory material in the substantially crystalline state.

12. The apparatus of claim 1, wherein the phase change material is a non-volatile memory material adapted to be altered to one of at least two resistance values within a range of resistance values in response to an electrical signal so as to provide single bit or multi-bit storage of information, wherein the electrical signal is provided to the phase change material using the first and second electrode materials.

13. The apparatus of claim 1, wherein the phase change material is a chalcogenide material.

14. The apparatus of claim 1, wherein the phase change material is an ovonic material.

15. The apparatus of claim 1, wherein the phase change material comprises tellurium.

16. The apparatus of claim 1, wherein the phase change material is a tellurium, antimony, germanium alloy.

17. A system, comprising:
    a processor;
    a wireless interface coupled to the processor; and
    a memory coupled to the processor, the memory including:
    a phase change material having a bottom portion, a top portion, and a lateral portion extending from the bottom portion to the top portion;
    a first electrode material contacting the bottom portion and the lateral portion of the phase change material; and
    a second electrode material contacting the top portion of the phase change material.

18. The system of claim 17, wherein the phase change material is cylinder-shaped.

19. The system of claim 17, wherein the first conductive material is cup-shaped and surrounds the bottom portion and the lateral portion of the phase change material.

* * * * *